(12) United States Patent
Oi

(10) Patent No.: US 6,562,692 B1
(45) Date of Patent: May 13, 2003

(54) DIELECTRIC ISOLATED WAFER AND ITS PRODUCTION METHOD

(75) Inventor: Hiroyuki Oi, Tokyo (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 0 days.

(21) Appl. No.: 09/720,595

(22) PCT Filed: Jun. 22, 1999

(86) PCT No.: PCT/JP99/03297

§ 371 (c)(1),
(2), (4) Date: Dec. 26, 2000

(87) PCT Pub. No.: WO00/01009

PCT Pub. Date: Jan. 6, 2000

(30) Foreign Application Priority Data

Jun. 26, 1998 (JP) ............................................. 10-181084
Jun. 26, 1998 (JP) ............................................. 10-181085

(51) Int. Cl.[7] ................................................. H01L 21/76
(52) U.S. Cl. ...................... 438/406; 438/430; 438/435; 438/458
(58) Field of Search ................................. 438/466, 424, 438/430, 435, 455, 456, 458, 406; 148/33, 34; 257/347

(56) References Cited

U.S. PATENT DOCUMENTS

| 5,091,330 A | * | 2/1992 | Cambou et al. | ............. | 438/406 |
| 5,204,282 A | * | 4/1993 | Tsuruta et al. | ............. | 438/406 |
| 5,459,104 A | * | 10/1995 | Sakai | ........................ | 438/406 |
| 5,728,621 A | * | 3/1998 | Zheng et al. | ............... | 438/427 |
| 6,239,004 B1 | * | 5/2001 | Aga et al. | ................. | 438/455 |

FOREIGN PATENT DOCUMENTS

| DE | 019741971 A1 | * | 4/1999 | ........... H01L/21/58 |
| EP | 0005310018 A2 | * | 10/1993 | ........... H01L/21/76 |
| JP | 61-191035 | | 8/1986 | |
| JP | 5-63071 | | 3/1993 | |
| JP | 5-82633 | | 4/1993 | |
| JP | 6151572 | | 5/1994 | |

* cited by examiner

*Primary Examiner*—Chandra Chaudhari
*Assistant Examiner*—David S Blum
(74) *Attorney, Agent, or Firm*—Pillsbury Winthrop LLP

(57) ABSTRACT

In a photolithography process in which a resist film having window is provided on the surface of silicon wafer during the production of a dielectric isolated wafer, after coating back surface resist onto silicon wafer, its entire surface is exposed to light to crosslink the entire back surface resist. Consequently, during development and rinsing to avoid flooding of window by back surface resist that has moved around to the front side of the wafer following coating of back surface resist, dissolving of the periphery of back surface resist by that developing solution can be prevented. In addition, after polishing the surface of a dielectric isolated wafer on which dielectric isolated silicon island is formed, low-temperature polysilicon is deposited by CVD, or SOG is coated and baked, onto the surface of the dielectric isolated wafer. As a result, depression that has formed during surface polishing of the dielectric isolated wafer is filled in by low-temperature polysilicon layer or the SOG layer. Next, this low-temperature polysilicon layer or SOG layer is removed from the surface by polishing. At this time, the filled in portion of depression on the wafer surface remains. As a result, the surface of the dielectric isolated wafer can be flattened.

8 Claims, 8 Drawing Sheets

LOW-TEMPERATURE CVD POLYSILICON GROWTH

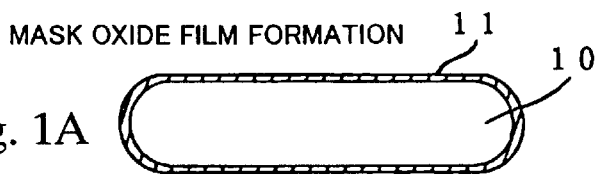
MASK OXIDE FILM FORMATION
Fig. 1A
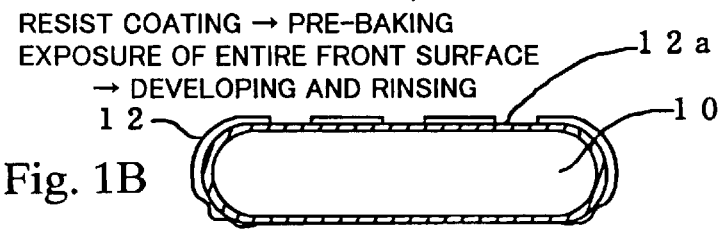
RESIST COATING → PRE-BAKING
EXPOSURE OF ENTIRE FRONT SURFACE
→ DEVELOPING AND RINSING
Fig. 1B
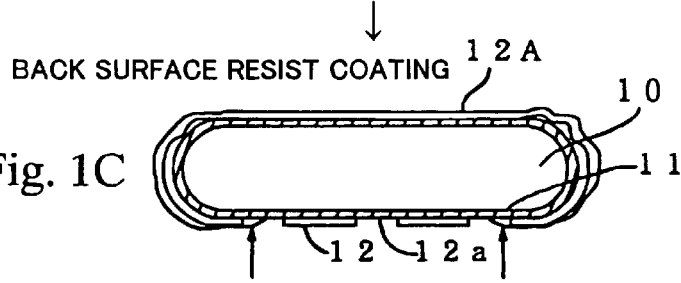
BACK SURFACE RESIST COATING
Fig. 1C
MOVEMENT AROUND WAFER
BY BACK SURFACE RESIST
EXPOSURE OF ENTIRE BACK SURFACE
Fig. 1C2
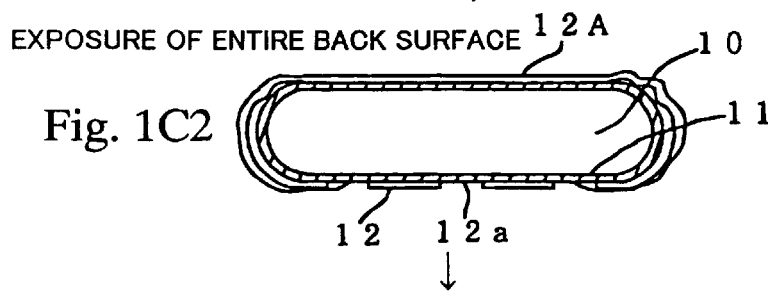
SECOND ROUND OF DEVELOPMENT AND
RINSING FROM FRONT SIDE
Fig. 1C1
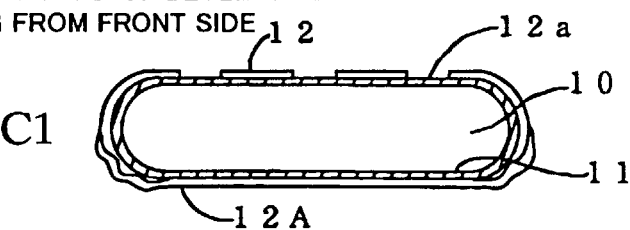
POST-BAKING
Fig. 1D
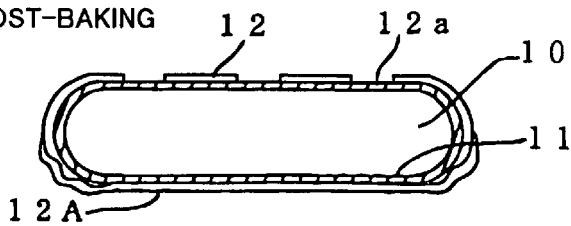

LOW-TEMPERATURE CVD POLYSILICON GROWTH

SURFACE POLISHING

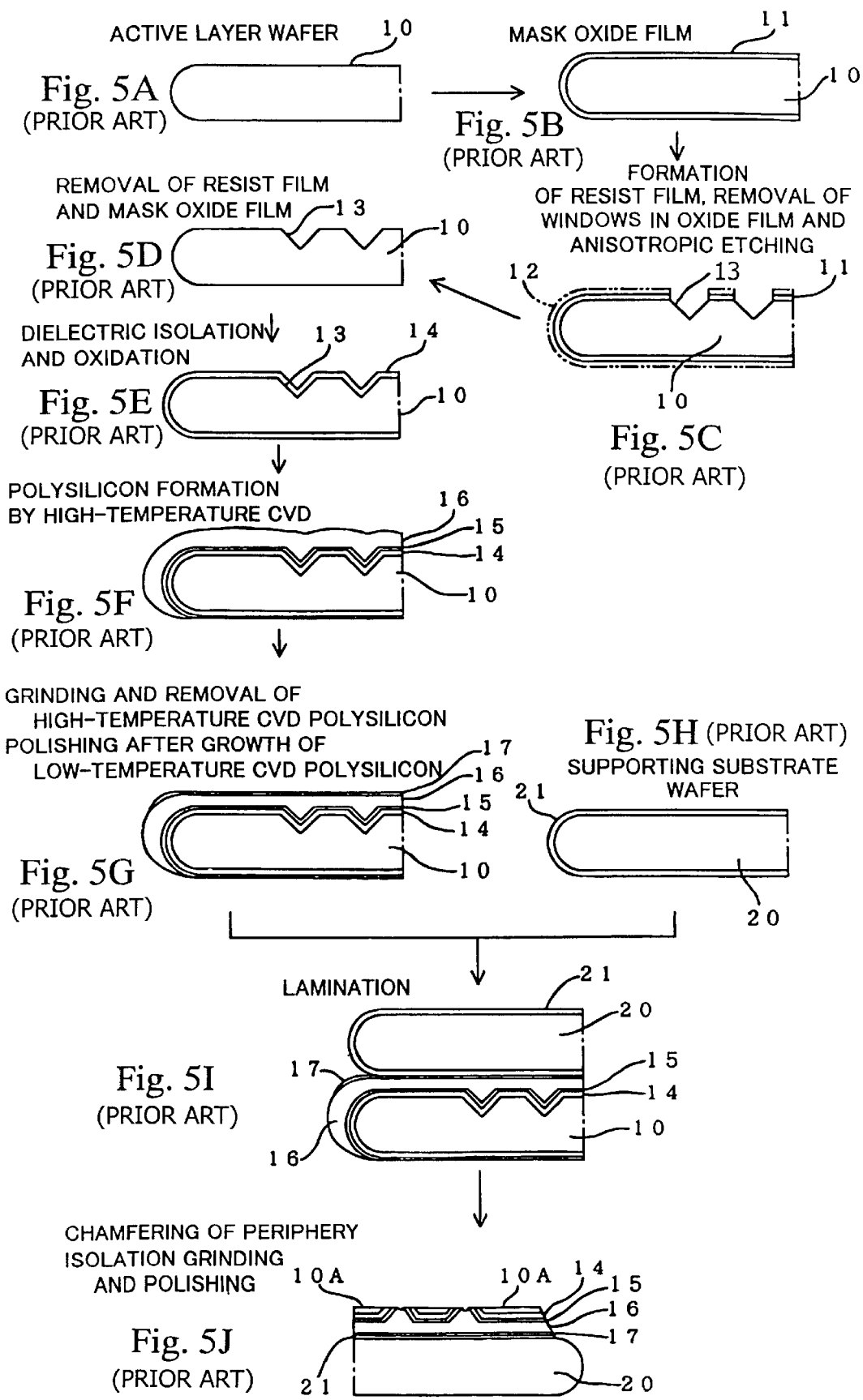

MASK OXIDE FILM FORMATION

↓

RESIST COATING → PRE-BAKING
EXPOSURE OF ENTIRE FRONT SURFACE
→ DEVELOPMENT AND RINSING

↓

BACK SURFACE RESIST COATING

MOVEMENT AROUND WAFER BY
BACK SURFACE RESIST

↓

POST-BAKING

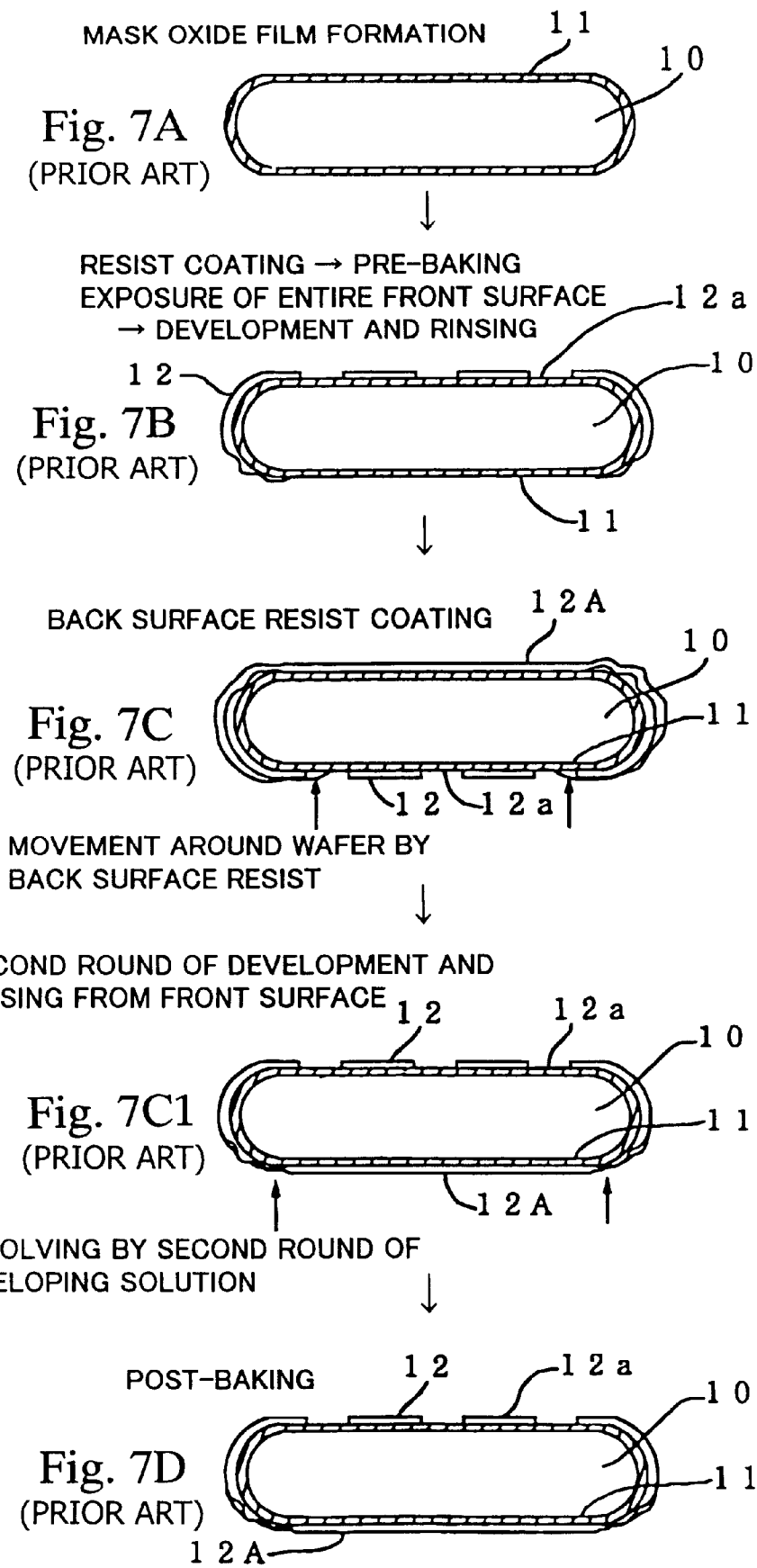

DIELECTRIC ISOLATED WAFER AND ITS PRODUCTION METHOD

This application is the national phase of international application PCT/JP99/03297 filed Jun. 22, 1999 which designated the U.S, and that international application published under PCT Article 21(2) in English.

TECHNICAL FIELD

The present invention relates to a dielectric isolated wafer and its production process. More specifically, the present invention relates to the production method of a dielectric isolated wafer that prevents negative resist coated on the back surface of a silicon wafer from moving around to the front surface of the wafer periphery, and flooding the window of the groove for dielectric isolation formed in the negative resist on the wafer front surface present in this region, and when developing the surface negative resist film after coating this negative resist on the back surface, the vicinity of the periphery of the lower negative resist film is less susceptible to dissolution even if the developing solution moves around to the wafer back surface.

In addition, the present invention also relates to a dielectric isolated wafer and its production method that flattens depressions (level differences) in the wafer front surface that have formed due to separation polishing of a silicon island of a dielectric isolated wafer during production of a dielectric isolated wafer having a dielectric isolated silicon island.

Furthermore, the present application is based on Japanese Patent Application No. Hei 10-181084 and Japanese Patent Application No. Hei 10-181085, the contents of which are incorporated herein by reference.

BACKGROUND ART

Typical dielectric isolated wafers are produced by forming a groove for dielectric isolation on the surface of a silicon wafer, laminating a dielectric isolated oxide film on top of it, growing a polysilicon layer on the dielectric isolated oxide film to a thickness roughly equal to the thickness of the wafer by high-temperature chemical vapor deposition (CVD), and producing silicon single crystal of the dielectric isolated silicon island by grinding and polishing from the silicon wafer side.

However, in the case of dielectric isolated wafers produced by this method, wafers were only able to be produced up to a diameter of 4 inches due to considerations for total thickness and warping. Therefore, in order to solve problems encountered when trying to increase the diameter of these wafers, a laminated dielectric isolated wafer has recently been developed that is produced by laminating a dielectric isolated layer in the form of an active layer and a supporting substrate wafer that supports it.

This laminated dielectric isolated wafer is produced by going through each of the steps in the explanatory drawings of FIGS. 5A–J that shows the production process of typical laminated dielectric isolated wafers. The following provides an explanation of this laminated dielectric isolated wafer with reference to FIGS. 5A–J.

To begin with, a silicon wafer 10, the surface of which is mirrored, is prepared for use as the active layer wafer (see FIG. 5A). Next, mask oxide film 11 is formed on the front and back surfaces of this silicon wafer 10 (see FIG. 5B), after which negative resist film 12 with window 12a is formed by photolithography. A window of a prescribed pattern is formed in oxide film 11 by means of this window to expose the upper layer of silicon wafer 10. Next, this silicon wafer 10 is immersed in etching solution (isopropyl alcohol (IPA)/KOH/H$_2$O) to perform anisotropic etching of the inside of window 12a of the wafer front surface (see FIG. 5C). As a result, dielectric isolation groove 13 having a V-shaped cross-section is formed in the wafer front surface. Furthermore, the anisotropic etching mentioned here refers to etching originating in the azimuth of the crystal surface of silicon wafer 10 in which the etching speed in the direction of depth is greater than that in the horizontal direction, and the etching speed is direction-dependent.

Next, negative resist film 12 is removed and the exposed mask oxide film 11 is washed and removed with dilute HF solution (see FIG. 5D). Subsequently, a dopant (such as Sb or As) can be thermally dispersed or ion injected into silicon wafer 10 as necessary. Dielectric isolated oxide film 14 is then formed by oxidizing heat treatment on the wafer front surface (see FIG. 5E). As a result, dielectric isolated oxide film 14 is also formed on dielectric isolation groove 13. Next, the front surface of this wafer is washed.

Subsequently, a seed amorphous silicon layer or seed polysilicon layer 15 is deposited on the front surface of silicon wafer 10 by low-temperature chemical vapor deposition (CVD) at about 600° C. (about 550–700° C.). After washing, high-temperature polysilicon layer 16 is grown to a thick layer on this seed amorphous silicon or seed polysilicon layer 15 by high-temperature CVD at about 1250° C. (about 1200–1300° C.) (see FIG. 5F). Next, the wafer periphery is chamfered, and the wafer back surface is flattened as necessary. Next, the high-temperature polysilicon layer on the front surface of the wafer is ground and polished to a thickness of 10–80 μm, and preferably 20–50 μm (see FIG. 5G). Subsequently, a low-temperature amorphous silicon layer or polysilicon layer 17 is formed to a thickness of about 1–5 μm, and preferably about 2–3 μm, by low-temperature CVD at about 600° C. (550–700° C.) on the front surface of the wafer, followed by polishing the low-temperature amorphous silicon layer or polysilicon layer 17 for the purpose of mirroring the laminated surfaces.

On the other hand, a silicon wafer 20 to serve as the supporting substrate wafer (which is covered by silicon oxide film 21 here) is prepared (see FIG. 5H) The front surface of this wafer is also mirrored. Next, silicon wafer 10 for the above active layer wafer is laminated onto silicon wafer 20 by contacting their respective mirrored surfaces (see FIG. 5I). Next, heat treatment is performed to increase the lamination strength of the laminated wafer. Next, as shown in FIG. 5J, the periphery of this silicon wafer 10 for the active layer is chamfered, and after removing oxide film 21 of silicon wafer 20 for the supporting substrate by washing with HF as necessary, silicon wafer 10 for the active layer is ground and polished.

Furthermore, the amount grounded of this silicon layer 10 for the active layer is the amount at which dielectric isolated oxide film 14 is exposed to the outside, dielectric isolated silicon island 10A appears on the front surface of high-temperature polysilicon layer 16 partitioned by dielectric isolated oxide film 14, and adjacent silicon islands are completely separated. A laminated dielectric isolated wafer is produced in this manner.

However, photolithography is employed to form window 12a for anisotropic etching of dielectric isolation groove 13 in negative resist film 12 of silicon wafer 10 as previously mentioned.

Photolithography refers to a method for writing a pattern onto the front surface of negative resist film 12 coated onto silicon wafer 10 by exposure to light, followed by development. The following provides an explanation of the flow of the photolithography process while referring to the explanatory drawings of a typical photolithography process of FIGS. 6A–D.

To begin with, negative resist 12 is coated onto the front surface of silicon wafer 10 on which is formed mask oxide film 11 (see FIG. 6A), after which the solvent in negative resist film 12 is effectively removed following coating by pre-baking. Next, negative resist layer 12 is exposed to light, developed and rinsed (see FIG. 6B). Consequently, window 12a for anisotropic etching is formed in negative resist film 12 on the front surface of the wafer. Furthermore, post-baking may be performed after this in which silicon wafer 10 is loaded into a baking oven following this to promote a crosslinking reaction of surface negative resist film 12 and make it harder. Next, negative resist 12A is coated onto the back surface of the wafer to prevent dissolution of the lower side of mask oxide film 11 covering silicon wafer 10 by etching solution during anisotropic etching of a later step. More specifically, after turning over silicon wafer 10 and coating negative resist 12A onto the wafer back surface (see FIG. 6C), the wafer is loaded into a baking oven, and upper and lower negative resist films 12 and 12A are post-baked to promote a crosslinking reaction of negative resist films 12 and 12A (see FIG. 6D).

In addition, in this typical method, when negative resist 12A is coated onto the back surface of silicon wafer 10, there was the risk of this back surface negative resist 12A moving around to the front surface of the wafer periphery and flooding window 12a of groove 13 for dielectric isolation formed in front surface negative resist film 12 present in this region (see FIGS. 6C and D). Therefore, a means of the prior art has been developed to resolve this problem.

Namely, after coating negative resist 12A onto the back surface of silicon wafer 10, as shown in FIG. 7C of the explanatory drawing of the lithography process pertaining to the means of the prior art of FIG. 7, silicon wafer 10 is again turned right side up, developing and rinsing treatment are performed from the front side of the wafer, and a portion of back surface negative resist 12A adhered in this window 12a is removed by washing. Furthermore, the work process performed for the other steps in FIGS. 7A through 7D is the same as that of each of the corresponding steps of FIGS. 6A through 6D.

However, according to this production process of dielectric isolated wafers of the prior art, when the second round of development and rinsing treatment is performed on the front surface of the wafer shown in FIG. 7C1 in order to eliminate flooding of window 12a by a portion of back surface negative resist 12A that has moved around to the front surface of the wafer, opposite from the movement of back surface negative resist 12A to the front side shown in FIG. 7C, this second round of developing solution ends up moving around to the back side of silicon wafer 10. As a result, the periphery of unexposed back surface negative resist 12A is dissolved by this second round of developing solution, resulting in the problem of the formation of saw tooth-shaped irregularities in the periphery of silicon wafer 10 by way of these dissolved portions during anisotropic etching. These wafer caused cracking of the wafer during wafer handling, as well as cracking and chipping in the following high-temperature polysilicon formation step.

In addition, according to this production method of dielectric isolated wafers of the prior art, the upper surface of wafer 10 for the active layer is ground in the finishing step of laminated dielectric isolated wafers, and the ground surface is then polished using an alkaline polishing agent until dielectric isolated silicon island (Si island) 10A partitioned with dielectric isolated oxide film 14 is exposed.

At this time, as shown in FIG. 8, depression 16a forms on the polished front surface of active layer wafer 10 due to differences in the polishing speeds of layers 10A, 14 and 16 respectively composing this surface. In particular, at the grain boundary where high-temperature polysilicon layers 16 meet that have grown along V-shaped dielectric isolated oxide film 14, the speed at which etching progresses is greater than the other dielectric isolated silicon island 10A and dielectric isolated oxide film 14, that may also result in the formation of depression 16a having a depth of about 0.3 $\mu$m.

When a deep depression is formed in this manner, in, for example, the photolithography process during production of a device by a user following product shipment, this depression hinders uniform coating of resist onto the wafer surface, causes problems such as the occurrence of circuit disconnection or inferior resolution, and during removal of the resist film after exposure, results in the risk of a portion of the film being left on the wafer surface. In addition, in other processes as well, depression 16a serves as a location for adsorption of debris. Moreover, there was also the problem of debris having been adsorbed to depression 16a normally being unable to be removed easily due to the narrow width of depression 16a.

DISCLOSURE OF THE INVENTION

The inventor of the present invention found that, if a back surface negative resist is coated onto a silicon wafer followed by exposing the entire surface to light in advance to induce a crosslinking reaction of the entire back surface negative resist film, even if developing solution moves around to the back side of the wafer during development of the front surface negative resist after coating the back surface negative resist, the periphery of this back surface negative resist film is not dissolved, thereby leading to the completion of the first invention of the present application.

The object of this first invention is to provide a production method of a dielectric isolated wafer that is able to prevent dissolution of the periphery of a negative resist film coated onto the back side of a wafer by developing solution during development treatment of a front surface negative resist after coating a back surface negative resist in a photolithography process.

In addition, another object of this first invention is to prevent partial damage of a negative resist film on the back side in the production method of a laminated dielectric isolated wafer.

This first invention is a production method of a dielectric isolated wafer in which, by covering the front and back surfaces of a silicon wafer with a mask oxide film, providing a windowed resist film on the upper surface of this mask oxide film, and masking this resist film to form a window of a prescribed pattern in the mask oxide film, a portion of the front surface of the silicon wafer is exposed through this window, a dielectric isolation groove is formed by anisotropic etching of a portion of this exposed silicon wafer front surface, a dielectric isolated oxide film is formed on the front surface of the silicon wafer, a polysilicon layer is grown on this dielectric isolated oxide film, the silicon wafer is ground and polished from the back side, and a silicon island is exposed on the polished surface that is separated by the dielectric isolated oxide film; wherein the above process of providing a windowed resist film comprises a step in which a window of a prescribed pattern is formed in this negative resist film, a step in which a negative resist is coated onto the mask oxide film of the back side, a step in which the entire surface of this negative resist film on the back side is exposed to light, and a step in which back surface negative resist adhered in the window of the front surface negative resist is removed.

High-temperature CVD is an example of a method for growing the polysilicon layer. This method consists of introducing a feed gas containing silicon into a reaction oven along with a carrier gas (such as $H_2$ gas), and precipitating the silicon that has formed by thermal decomposition or reduction of the feed gas on a silicon wafer heated to a high temperature. Examples of compounds containing silicon that are normally used include $SiCl_4$ and $SiHCl_3$.

An example of the reaction oven is a vertical (pancake) oven that is heated by high-frequency induction into which gas is introduced while rotating a susceptor on which a silicon wafer is placed in a dome-shaped quartz bell jar. Moreover, another type of oven that is used is a cylinder (barrel) oven in which silicon wafers are attached to each surface of a hexagonal column-shaped susceptor housed in a quartz container, followed by rotating this susceptor while introducing gas and heating with an infrared lamp.

The polysilicon growth temperature varies according to the heating system of the oven. In the case of a typical vertical oven used most commonly for this application, a growth temperature of 1200–1290° C. is preferable, and that of 1230–1280° C. is particularly preferable. If the growth temperature is below 1200° C., the problem results in which the wafer is susceptible to cracking. In addition, if the growth temperature exceeds 1290° C., slipping occurs which also results in the problem of the silicon wafer being susceptible to cracking.

The thickness of the polysilicon layer is the thickness resulting from adding the thickness of the polysilicon layer desired to remain to a thickness equal to two to three times the depth at which anisotropic etching was performed. If the thickness of the polysilicon layer is less than twice the depth at which anisotropic etching was performed, the groove of anisotropic etching is not adequately filled in. On the other hand, if the thickness of the polysilicon layer is greater than three times the depth at which anisotropic etching was performed, the layer ends up being deposited unnecessarily thick making this uneconomical.

In addition, in the case of forming a diffusion layer on an active layer wafer, carelessly extending thermal hysteresis is unsuitable because it significantly changes the diffusion profile.

Examples of anisotropic etching solutions that can be used include KOH (IPA/KOH/$H_2O$), KOH (KOH/$H_2O$), KOH (hydrazine/KOH/$H_2O$ and other alkaline etching solutions. Ordinary conditions can be used for anisotropic etching conditions.

In addition, typical conditions can also be employed for the conditions of each step for forming the window for anisotropic etching in the negative resist film on the wafer front surface.

Moreover, ordinary exposure conditions can be employed for the conditions under which the entire back surface negative resist film is exposed to light, which is one of the characteristics of the present invention.

In the production method of a dielectric isolated wafer according to a first invention of the present application, the above dielectric isolated wafer may be a laminated dielectric isolated wafer produced by laminating the above active layer wafer in which a dielectric isolated silicon island is formed, and its supporting substrate wafer.

According to this first invention, mask oxide films are formed on both the front and back surfaces of the silicon wafer.

Next, a windowed negative resist film is formed on the front surface of this silicon wafer. Namely, a negative resist is coated onto the front surface of the silicon wafer, and a prescribed pattern is exposed on a mask oxide film using this negative resist film as a mask. Furthermore, development and rinsing treatment followed by post-masking may also be performed following exposure.

Subsequently, the silicon wafer is turned over and a negative resist is coated onto the wafer back surface of the mask oxide film.

Next, a crosslinking reaction is allowed to proceed over the entire back surface negative resist film by exposing the entire surface of this back surface negative resist film to light. As a result, chemical resistance to the developing solution is imparted to the back surface negative resist film.

Next, the silicon wafer is turned right side up and developing treatment is performed on the front surface negative resist film after exposure. Furthermore, in the front surface negative resist film is to be developed immediately after exposure, this development consists of a second round of developing treatment to avoid flooding of the window caused by back surface negative resist that has come around to the front of the wafer.

At this time, even if developing solution comes around to the back of the silicon wafer and adheres to the periphery of the back surface negative resist, there is hardly any risk of this portion being dissolved. This is because the back surface negative resist film has been given enhanced chemical resistance by full surface exposure.

Subsequently, this silicon wafer, which has been covered by front and back negative resist films, is immersed in etching solution, and anisotropic etching is performed on the portion of the silicon wafer inside of the mask oxide film and this film through the window in the wafer front surface. As a result, a dielectric isolation groove is formed.

Next, the negative resist films of the front and back surfaces along with the mask oxide film are removed.

A dielectric isolated oxide film is then formed on the front surface of the wafer by oxidizing heat treatment.

Subsequently, after growing polysilicon on this dielectric isolated oxide film, the silicon wafer is ground and polished from the back of the wafer resulting in the appearance of the dielectric isolated silicon island. Thus, a dielectric isolated wafer is produced in this manner.

In the case the dielectric isolated wafer is a laminated dielectric isolated wafer as previously mentioned in particular, the produced active layer wafer having a dielectric isolated silicon island made of polysilicon and its supporting substrate wafer are laminated to produce a laminated dielectric isolated wafer having the effect of the present invention. As a result, the present invention can be applied to laminated dielectric isolated wafers for which there is little risk of decreased quality of the dielectric isolated silicon island due to thermal decomposition caused by high-temperature CVD.

In addition, the inventors of the present invention noticed that various problems that occur during device production by a user as previously described as a result of either depositing (growing) polysilicon on the front surface of a wafer or baking SOG (spin-on-glass) after coating following surface polishing of a dielectric isolated wafer are resolved if the polysilicon layer or SOG layer is removed by polishing while leaving a portion in which depressions in the wafer surface are filled in, thereby leading to completion of the second invention of the present application.

The object of this second invention is to provide a dielectric isolated wafer and its production method in which the surface of the dielectric isolated wafer is flattened.

In addition, another object of this second invention is to provide a dielectric isolated wafer and its production method that is no occurrence of quality deterioration of the silicon island during adherence of an embedded polysilicon layer.

Moreover, still another object of this second invention is to provide a production method of a dielectric isolated wafer for which there is little risk of depressions in the wafer surface reforming during removal of a polysilicon layer by polishing.

The dielectric isolated wafer according to this second invention is a dielectric isolated wafer comprising polishing the front surface of a dielectric isolated wafer on which a dielectric isolated silicon island has been formed, and then forming a polysilicon layer on the front surface of this dielectric isolated wafer by CVD, as a result of which depressions in the wafer surface that formed during surface polishing of the above dielectric isolated wafer are filled in, after which the polysilicon layer is removed by polishing while leaving a portion in which the above depressions are filled in.

CVD for forming the polysilicon layer refers to a method in which a feed gas containing silicon is introduced into a reaction oven along with a diluting gas (normally $N_2$ gas) to precipitate silicon formed by thermal decomposition or reduction of the feed gas on a silicon wafer heated to a high temperature. Examples of silicon-containing compounds that are used include $SiH_2Cl_2$ and $SiH_4$. Examples of CVD methods include high-temperature CVD and low-temperature CVD.

An example of a reaction oven is a horizontal oven in which, for example, a silicon wafer on a boat fixed inside a horizontally long quartz tube is resistance-heated while introducing a gas. In addition, another example of a reaction oven is a vertical oven in which gas is introduced while rotating a vertical quartz (SiC) boat on which is placed a silicon wafer in a bell-shaped quartz (SiC) bell jar followed by high-frequency induction heating.

The thickness of the amorphous silicon layer or polysilicon layer deposited (grown) by CVD is preferably 0.2–5 $\mu$m, and particularly preferably 0.4–1.0 $\mu$m. If the thickness is less than 0.2 $\mu$m, the problem results in which the level differences in the surface are not adequately eliminated. In addition, if the thickness exceeds 5 $\mu$m, the problem results in which the amount of time for flattening polishing becomes unnecessarily long.

Examples of polishing liquids used during surface polishing of the dielectric isolated wafer include those in which polishing grit ($SiO_2$) having a mean particle size of 10–100 $\mu$m is added at 3–4 wt % to an alkaline etching solutions such as NaOH or KOH.

The amount of polysilicon layer polished is the amount that allows the polysilicon layer to be removed while leaving the portion at which depressions formed in the surface of the dielectric isolated wafer are filled in.

The above dielectric isolated wafer may also be a laminated wafer in which an active layer wafer, in which a dielectric isolated silicon island is formed in the front surface, and a supporting substrate wafer, are laminated. Commonly known wafer lamination technologies can be employed for this lamination.

In addition, th is production method of a dielectric isolated wafer according to this second invention comprises polishing the surface of a dielectric isolated wafer in which is formed a dielectric isolated silicon island followed by the formation of a polysilicon layer by CVD on the front surface of this dielectric isolated wafer, said method comprising a step in which depressions in the wafer surface that were formed during surface polishing of the above dielectric isolated wafer are filled in, and a step in which the polysilicon layer is removed by polishing while leaving the portion at which the above depressions are filled in.

Here, the description relating to the dielectric isolated wafer according to the above second invention also applies to this production method of a dielectric isolated wafer.

Furthermore, examples of methods that can be used for forming the amorphous silicon layer or polysilicon layer include reduced pressure CVD and normal pressure CVD. The pressure during film deposition by reduced pressure CVD is about 10–80 Pa.

In the production method of a dielectric isolated wafer according to this second invention, the polysilicon layer for filling in the above depressions may be formed by low-temperature CVD at 550–700° C.

If the temperature is lower than 550° C., the problem results in which the deposition rate slow down. In addition, if the temperature exceeds 700° C., the polysilicon particles become larger resulting in the problem of increased difficulty in flattening during later flattening polishing.

In addition, the pressure during film deposition by this low-temperature CVD is 10–80 Pa when performed by reduced pressure CVD or normal pressure when performed by normal pressure CVD.

In addition, another form of a dielectric isolated wafer according to the second invention is a dielectric isolated wafer for which, after polishing the surface of a dielectric isolated wafer on which a dielectric isolated silicon island has been formed, by forming an SOG layer on the surface of this dielectric isolated wafer, depressions in the wafer surface that form during surface polishing of the above dielectric isolated wafer are filled in, after which the SOG layer is removed by polishing while leaving the above filled in portion of the depressions.

An example of a method for coating SOG (ethyl silicate) involves performing spin coating while rotating the dielectric isolated wafer.

In addition, another form of the production method of a dielectric isolated wafer according to the second invention is a production method of a dielectric isolated wafer by polishing the surface of a dielectric isolated wafer on which is formed a dielectric isolated silicon island followed by forming an SOG layer by coating SOG onto the surface of this dielectric isolated wafer and baking, comprising a step wherein depressions in the wafer surface that occur during surface polishing are filled in, and a step wherein this SOG layer is removed by polishing while leaving the above filled in portion of the depressions.

The coating thickness of SOG is preferably 0.2–2.0 $\mu$m, and particularly preferably 0.3–0.6 $\mu$m. If the coating thickness is less than 0.2 $\mu$m, the above filling in of the depressions is inadequate. In addition, if the coating thickness exceeds 2.0 $\mu$m, over-coating is required in the SOG coating method resulting in the problem of increased susceptibility to uneven thickness.

SOG baking is performed in the $N_2$ gas atmosphere in a harness and so forth to vaporize the alcohol content in the SOG. The baking temperature is 200–250° C. If the baking temperature is lower than 200° C., the problem occurs in which a long period of time is required to vaporize the alcohol content in the SOG. In addition, if the baking temperature exceeds 250° C., although there is no particular problem provided the temperature is not so high as to cause significant diffusion of the dopant present (e.g., 900° C. or higher), the use of this high a temperature is not required. The SOG baking time is 30–60 minutes.

According to this second invention, after polishing the surface of a dielectric isolated wafer on which has been formed a dielectric isolated silicon island, a polysilicon layer is deposited (grown) by CVD, or an SOG layer is formed by coating with SOG and baking, onto the surface of the dielectric isolated wafer. When this is done, depressions formed during surface polishing of the dielectric isolated wafer are filled in by the polysilicon layer or SOG layer. Next, this polysilicon layer or SOG layer is removed by polishing the surface. At this time, polishing is performed while leaving behind the filled in portion of the depressions on the wafer surface. As a result, the surface of the dielectric isolated wafer can be flattened.

In particular, this second invention can also be applied to a laminated dielectric isolated wafer as previously mentioned. Accordingly, in the case of comparing with the production method of a dielectric isolated wafer in a non-laminated method, since warping of the wafer can be held to a low level, the present invention can also be applied to large-diameter wafers measuring 5 inches or more in diameter.

Moreover, in the case the polysilicon layer for filling in the depressions in the production method of a dielectric isolated wafer as described above is a low-temperature amorphous silicon layer or polysilicon layer formed by low-temperature CVD at 550–700° C., it has smaller crystal particles as compared with a high-temperature polysilicon layer, thereby reducing the risk of depressions in the wafer surface reforming during removal of the polysilicon layer by polishing.

Furthermore, it is also possible to carry out the present invention by combining the above first and second inventions. In this case, both the effects of the above first and second inventions are demonstrated.

BRIEF DESCRIPTION OF THE DRAWINGS

FIGS. 1A–D are explanatory drawings showing a photolithography process in the production method of the dielectric isolated wafer according to a first embodiment of the present invention.

FIGS. 5A–J are explanatory drawings showing a production process of a typical laminated dielectric isolated wafer.

FIGS. 7A–D are explanatory drawings of a photolithography process according to the prior art.

BEST MODE FOR CARRYING OUT THE INVENTION

Figure 2A:
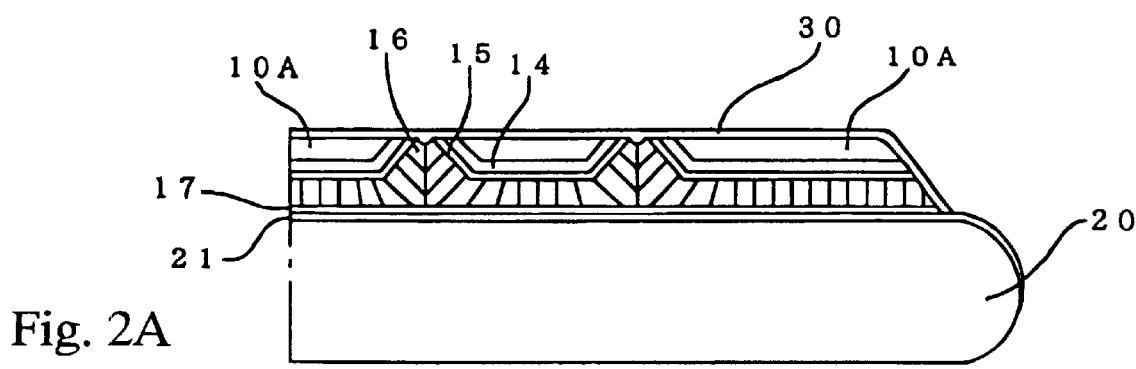
FIGS. 2A–B are explanatory drawings showing a production process of a laminated dielectric isolated wafer as claimed in a third embodiment of the present invention.

The following provides an explanation of the production method of a dielectric isolated wafer as claimed in the embodiments of the present invention. Furthermore, this explanation uses the example of a laminated dielectric isolated wafer explained as an example of the prior art previously described. Thus, the same reference numerals are used for those constituents that are the same as those shown in FIGS. 5A–J, 6A–D, 7A–D and 8. Reference symbol 10 is a silicon wafer for the active layer wafer, reference symbol 1 OA is a dielectric isolated silicon island, reference symbol 11 is a mask oxide film, reference symbol 12 is a negative resist film, reference symbol 12a is a window, reference symbol 13 is a dielectric isolation groove, reference symbol 14 is a dielectric isolated oxide film, reference symbol 16 is polysilicon, reference symbol 16a is a depression, reference symbol 20 is a silicon wafer for the supporting substrate wafer, reference symbol 30 is a low-temperature polysilicon layer (polysilicon layer), and reference symbol 300 is an SOG layer.

FIGS. 1A–D are an explanatory drawing showing a photolithography process of the production method of a dielectric isolated wafer as claimed in a first embodiment of the present invention. The basic process of the production method of the dielectric isolated wafer of this first embodiment of the present invention is the same as the production process of a typical laminated dielectric isolated wafer shown in FIGS. 5A–J and 7A–D explained in the section on the prior art. In the present invention, however, a portion of the basic photolithography process during production of the dielectric isolated wafer shown in FIGS. 7A–D differ from the case of the prior art.

To begin with, a silicon wafer 10 is obtained for which the front and back surfaces have been mirrored to serve as the active layer wafer (see FIG. 5A).

Next, mask oxide film 11 is formed on the front and back surfaces of this silicon wafer 10 (see FIG. 5B).

Next, negative resist film 12 with window 12a is formed by photolithography.

Next, silicon wafer 10 is immersed in etching solution (IPA/KOH/$H_2O$) to perform anisotropic etching of the wafer surface (see FIG. 5C). As a result, groove 13 for dielectric isolation having a V-shaped cross-section is formed in the wafer surface.

Next, negative resist film 12 is removed, after which the exposed mask oxide film 11 is removed (see FIG. 5D).

Subsequently, a dopant is injected into the silicon as necessary, after which dielectric isolated oxide film 14 is formed on the wafer surface by oxidizing heat treatment (see FIG. 5E). As a result, dielectric isolated oxide film 14 is also formed on dielectric isolation groove 13.

Next, the surface of the wafer is washed.

Subsequently, seed polysilicon layer 15 is deposited by low-temperature CVD at about 600° C. on the surface of silicon wafer 10.

After washing, high-temperature polysilicon layer 16 is grown to a thick layer on this seed polysilicon layer 15 by high-temperature CVD at about 1250° C. (see FIG. 5F).

Next, the wafer periphery is chamfered and the back surface of the wafer is flattened as necessary. Next, high-temperature polysilicon layer 16 on the surface of the wafer is ground and polished to a thickness of about 30 $\mu$m (see FIG. 5G).

Subsequently, after forming low-temperature polysilicon layer 17 having a thickness of about 3.0 $\mu$m on the wafer surface by low-temperature CVD at 600° C., the surface of low-temperature polysilicon layer 17 is polished for the purpose of mirroring the laminated surfaces.

On the other hand, a silicon wafer 20 (which here is covered with silicon oxide film 21) is obtained to serve as a supporting substrate wafer (see FIG. 5H). The surface of the wafer is then mirrored.

Next, silicon wafer 10 for the above active layer wafer is laminated onto this silicon wafer 20 by bringing into contact the corresponding mirrored surfaces (see FIG. 5I).

Next, heat treatment is performed to enhance the lamination strength of this laminated wafer.

Next, as shown in FIG. 5J, the periphery of this silicon wafer 10 for the active layer is chamfered, and after removing oxide film 21 of silicon wafer 20 for the supporting substrate by washing with HF as necessary, silicon wafer 10 for the active layer is ground and polished. The amount of this silicon wafer 10 that is grounded is the amount at which dielectric isolated oxide film 14 is exposed to the outside, dielectric isolated silicon island 10A appears on the front surface of high-temperature polysilicon layer 16 partitioned by dielectric isolated oxide film 14, and adjacent silicon islands are completely separated.

A laminated dielectric isolated wafer is produced in this manner.

The following provides an explanation of the photolithography process in this first embodiment. To begin with, negative resist 12 is spin-coated onto the surface of silicon wafer 10 (see FIG. 1A) on which mask oxide film 11 is formed and for which the surface is held level.

Next, after going through pre-baking, exposure, development and rinsing steps normally performed in this photolithography process, window 12a of a prescribed pattern is provided in this negative resist film 12 (see FIG. 1B). Furthermore, this may be followed by placing silicon wafer 10 in a baking oven not shown to post-bake negative resist film 12 on the surface of the wafer.

Subsequently, silicon wafer 10 with window 12a is turned over and negative resist 12A is spin-coated onto the back surface of the wafer. At this time, back surface negative resist 12A moves around to the front surface of the wafer periphery and floods window 12a formed in front surface negative resist film 12 present in this region (see FIG. 1C).

Next, the entire surface of back surface negative resist 12A is exposed to light to crosslink this back surface negative resist 12A (see FIG. 1C2). This step is a characteristic of the present invention. As a result of performing this crosslinking reaction, the chemical resistance of back surface negative resist film 12A to etching solution is enhanced.

Subsequently, exposed silicon wafer 10 is turned right side up, and a second round of development and rinsing treatment is performed from the front side of the wafer. As a result, the above-mentioned back surface negative resist 12A that is flooding window 12a is removed by washing. At this time, the second round of developing solution moves around to the back side of the wafer periphery and dissolves a portion of the periphery of back surface negative resist film 12 (see FIG. 1C1).

However, as shown in FIG. 1C2, this back surface negative resist film 12A has been crosslinked in advance by exposing the entire surface to light giving it enhanced chemical resistance. As a result, the periphery of back surface negative resist film 12A is resistant to dissolution even though it is subjected to a second round of developing solution.

Subsequently, silicon wafer 10 is placed in a baking oven and front and back surface negative resists 12 and 12A are post-baked.

In the present embodiment, since a laminated dielectric isolated wafer is used in which active layer wafer 10, having dielectric isolated silicon island 10A, and supporting substrate wafer 20 are laminated together, it is not necessary to grow the polysilicon layer to a thick layer by high-temperature CVD.

Next, the following provides an explanation of the production method of a dielectric isolated wafer as claimed in a second embodiment of the present invention.

This production method of the dielectric isolated wafer of a second embodiment consists of sequentially coating front surface negative resist 12 onto the surface of silicon wafer 10 of FIG. 1B in the production method of the first embodiment, followed by turning over silicon wafer 10 without developing or rinsing front surface negative resist film 12 so that the back side of the wafer is facing up. After then coating back surface negative resist 12 onto the back side of this wafer, the entire surface of this film 12 is exposed to light. Next, silicon wafer is turned right side up, front surface negative resist film 12 is developed and rinsed to form window 12a, and front and back surface negative resist films 12 and 12A are post-baked.

In this second embodiment, development treatment of front surface negative resist film 12 does not have to be performed twice as in the first embodiment, but only needs to be performed once. As a result, the number of production steps of the dielectric isolated wafer can be reduced.

Next, the following provides an explanation of a dielectric isolated wafer and its production method as claimed in a third embodiment of the present invention.

To begin with, a silicon wafer is produced and obtained having mirrored front surface to serve as the active layer wafer (see FIG. 5A).

Next, mask oxide film 11 is formed on the surface of this silicon wafer 10 (see FIG. 5B).

Next, resist film 12 is adhered to oxide film 11. A window of a prescribed pattern is then formed in this resist film 12.

Subsequently, a window having the same pattern is formed in oxide film 11 through this window, and a portion of the surface of silicon wafer 10 is exposed.

Next, resist film 12 is removed.

Moreover, this silicon wafer 10 is immersed for a prescribed amount of time in etching solution (IPA/KOH/$H_2O$). As a result, a concave irregularity (depression) of a prescribed pattern is formed in the surface of the silicon wafer. Anisotropic etching is then performed on the wafer surface (FIG. 5C) resulting in the formation of dielectric isolation groove 13 having a V-shaped cross-section.

Next, mask oxide film 11 is removed by washing with a dilute HF solution (FIG. 5D). At this time, a dopant may be introduced into the silicon bulk.

Next, dielectric isolated oxide film 14 of a prescribed thickness is formed on the silicon wafer surface by oxidizing heat treatment (FIG. 5E).

The wafer surface is then washed.

Next, seed polysilicon layer 15 is deposited on the surface of this silicon wafer 10 by low-temperature CVD at about 600° C.

Moreover, after washing, high-temperature polysilicon layer 16 is grown to a prescribed thickness on this seed polysilicon layer 15 by high-temperature CVD at about 1250° C. (FIG. 5F).

Next, the periphery of the wafer is chamfered and the wafer back surface is flattened as necessary.

Next, high-temperature polysilicon layer 16 on the wafer surface is ground and polished to a thickness of 30 μm (FIG. 5G).

Alternatively, after this, low-temperature polysilicon layer 17 may be deposited to a thickness of 3 μm on the wafer surface as necessary by low-temperature CVD at 600° C. followed by polishing the surface.

On the other hand, silicon wafer 20 is obtained for the supporting substrate (FIG. 5H).

Next, the above silicon wafer 10 for the active layer is laminated onto this silicon wafer 20 by aligning the corresponding mirrored surfaces (FIG. 5I).

This laminated wafer 30 is then subjected to a prescribed lamination heat treatment.

Next, as shown in FIG. 5J, the periphery of this active layer wafer side is chamfered, and after removing oxide film 21 of supporting substrate wafer 20 as necessary, the surface of the active layer wafer is ground and polished. The amount of this active layer wafer grounded is the amount at which dielectric isolated silicon island 10A partitioned by dielectric isolated oxide film 14 appears (also see FIG. 8).

FIGS. 2A and B are explanatory drawings showing the production process of a laminated dielectric isolated wafer as claimed in this third embodiment of the present invention.

In this manner, a laminated dielectric isolated wafer is produced as shown in FIG. 5J. At this time, depression 16a having a depth of about 0.3 μm produced during surface polishing is formed in the surface of the active layer wafer (also see FIG. 8).

Figure 3:
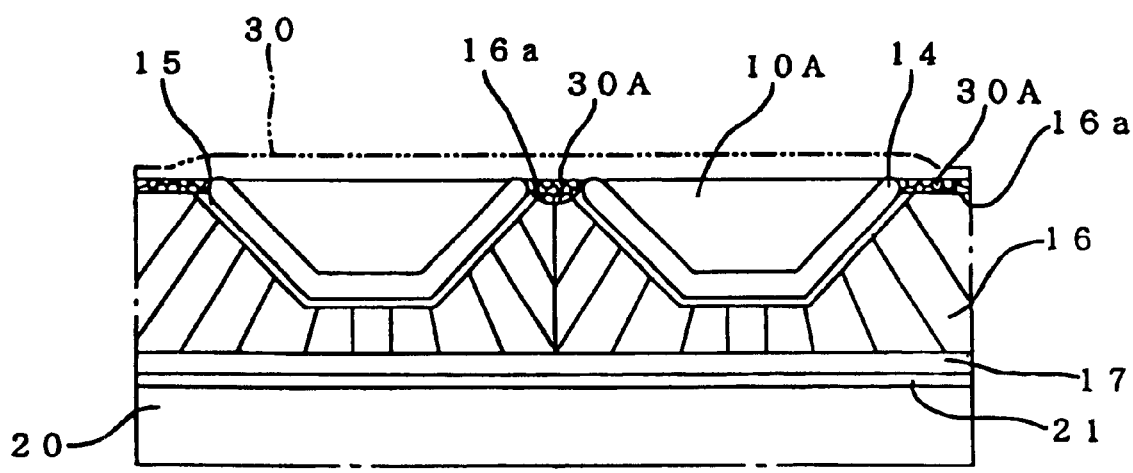
FIG. 3 is an enlarged cross-sectional drawing of the essential portion of a laminated dielectric isolated wafer produced by the production method of the dielectric isolated wafer according to a third embodiment of the present invention.

After inserting this laminated dielectric isolated wafer into a reaction oven, SiH$_4$, which serves as the growth gas a prescribed concentration, is introduced into the oven along with diluting gas (H$_2$ gas), and low-temperature polysilicon layer 30 is laminated to a thickness of 0.5 μm on the entire surface of the active layer wafer heated to 600° C. by a resistance heater. Furthermore, the pressure during deposition is 50 Pa. As a result, the above depression 16a is filled in by low-temperature polysilicon layer 30 (see dotted line in FIG. 3). FIG. 2A shows this state.

Figure 2B:
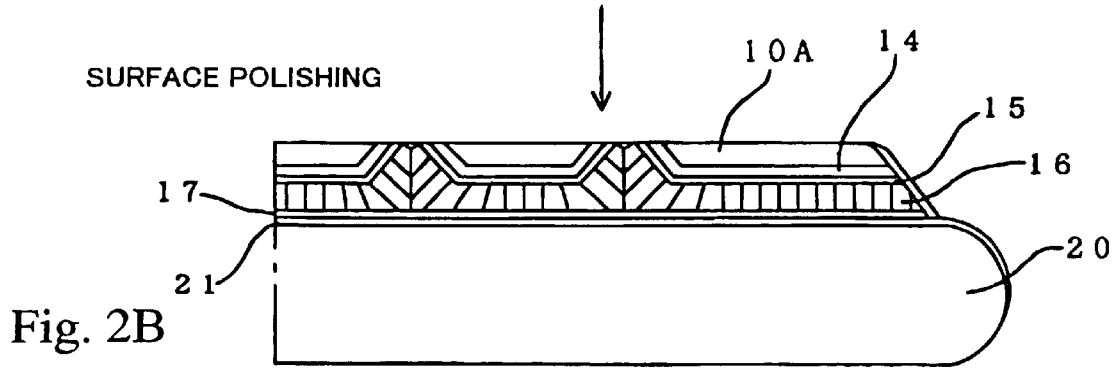

Next, as shown in FIG. 2B, the surface of this polysilicon layer 30 is removed by polishing with a commonly known polishing device using NaOH solution for the polishing liquid and SiO$_2$ polishing grit while leaving behind only the filled in portion 30A of depression 16a. More specifically, the surface is polished until the surface of dielectric isolated silicon island 10A is exposed.

Consequently, the surface of the active layer wafer can be flattened. As a result, resist can be uniformly coated onto a wafer surface in, for example, the photolithography process during device production by a user. In addition, circuit disconnection and deterioration of resolution can be prevented during exposure of this photolithography process, and when removing the resist film after exposure, the risk of a portion of this film remaining on the wafer surface can be eliminated. In addition, the entrance of debris into this depression 16a and this serving as a site for adsorption of debris can be prevented in other processes as well.

In this manner, since a laminated dielectric isolated wafer is produced that combines an active layer wafer, which has dielectric isolated silicon island 10A, and a supporting substrate wafer 20, high-temperature heating for an extended period of time by high-temperature CVD required in the case of not employing a lamination method is no longer necessary. In addition, warping of the dielectric isolated substrate can be held to a low level. In addition, since depression 16a is filled in by a low-temperature amorphous silicon layer or polysilicon layer 30 by low-temperature CVD at 550–700° C., the risk of depression 16a reforming on the wafer surface during removal of this low-temperature amorphous silicon layer or polysilicon layer 30 by polishing can be reduced. This is because the crystal particles of the low-temperature amorphous silicon layer or polysilicon layer are smaller than those of a high-temperature polysilicon layer.

Subsequently, the flatness of the surface of the active layer wafer of this dielectric isolated wafer was actually attempted to be measured using a contact needle type flatness gauge.

The average flatness of the surfaces of 25 active layer wafers produced according to the method of the prior art was 0.24 μm. In contrast, the average flatness in the case of employing the production method of the present invention was 0.01 μm.

Figure 4A:
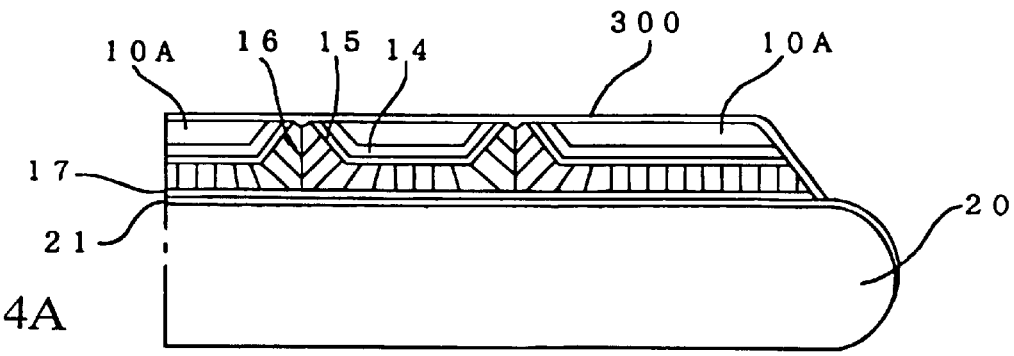
FIGS. 4A–C are explanatory drawings showing a production process of a laminated dielectric isolated wafer according to a fourth embodiment of the present invention.
Figure 4B:
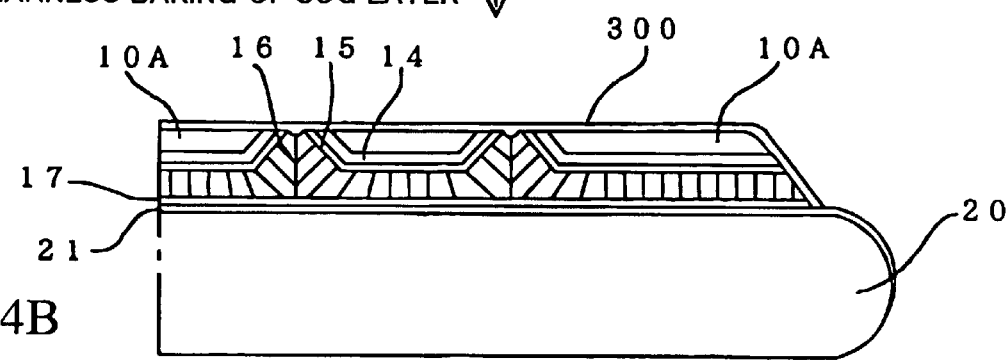
Figure 4C:
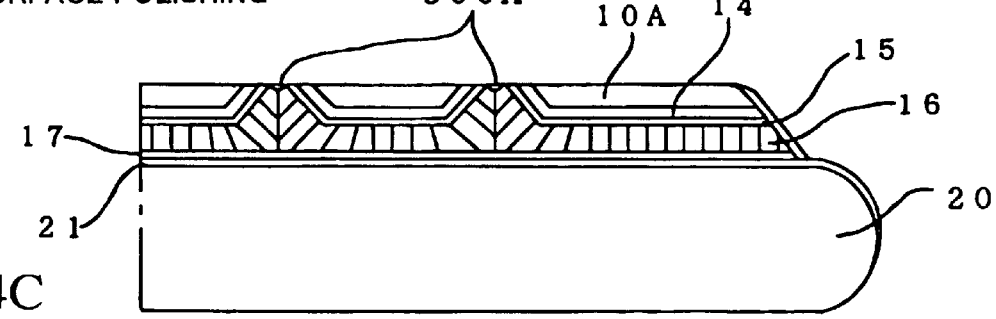
Figure 6A:
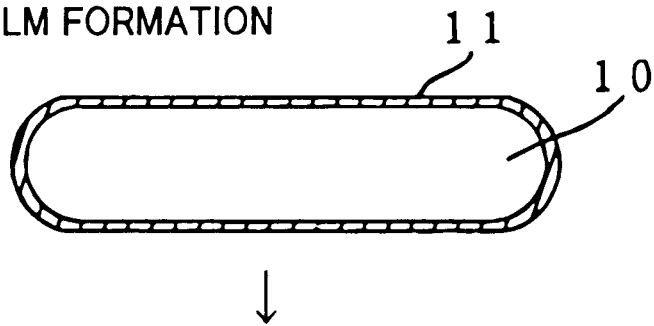
FIGS. 6A–D are explanatory drawings of a typical photolithography process.
Figure 6B:
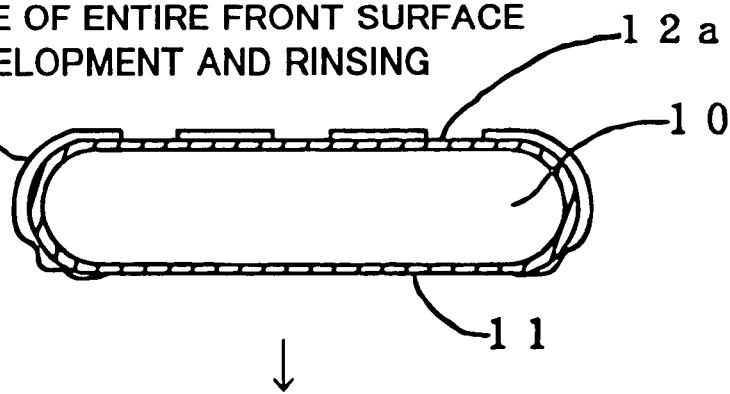
Figure 6C:
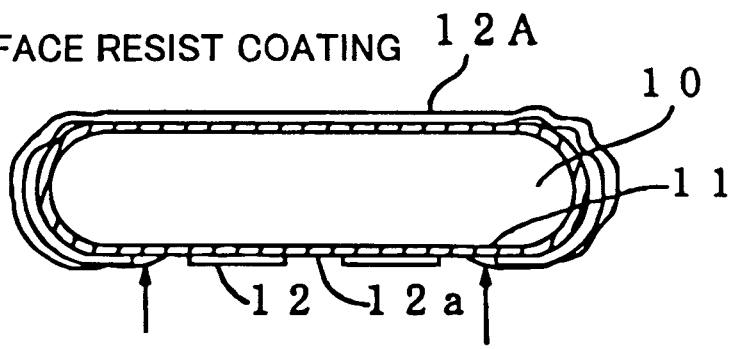
Figure 6D:
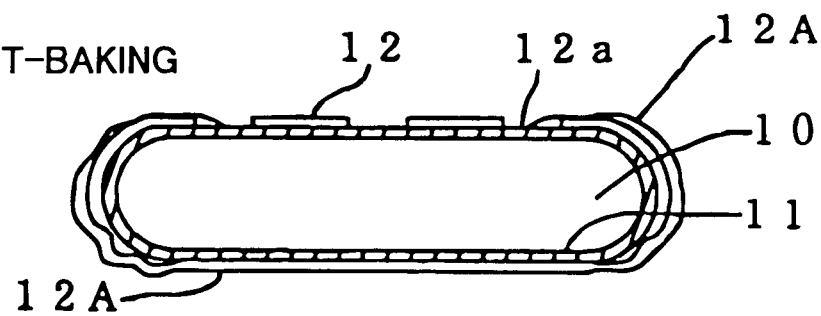
Figure 8:
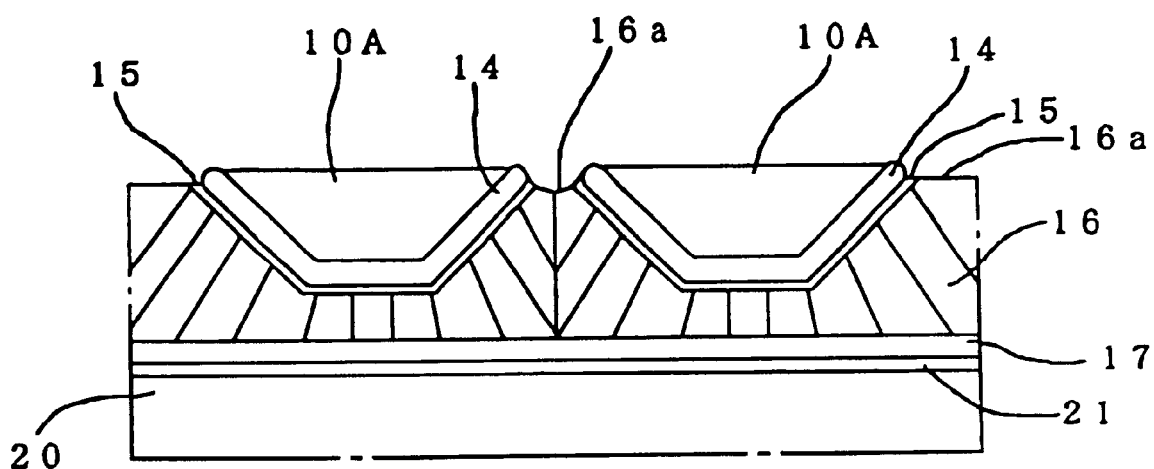
FIG. 8 is an enlarged cross-sectional drawing of the essential portion of a laminated dielectric isolated wafer produced according to the prior art.

Next, an explanation is provided of a dielectric isolated wafer and its production method of a fourth embodiment of the present invention based on FIGS. 4A–C which are explanatory drawings showing the production process of a laminated dielectric isolated wafer of this fourth embodiment of the present invention.

In this fourth embodiment, an example is shown of employing a method in which SOG (ethyl silicate) is formed on the surface of the active layer wafer as a method for providing filled in portion 300A that fills depression 16a on the surface of the active layer wafer.

Namely, as shown in FIG. 4A, SOG300 is spin-coated to a thickness of 0.6 μm onto the surface of the active layer wafer. Subsequently, as shown in FIG. 4B, this SOG layer 300 is baked solid while vaporizing alcohol by a harness. This baking is performed for a baking time of 30–60 minutes and at a baking temperature of 200–250° C. in an N$_2$ gas atmosphere. Following this baking, polishing is performed to flatten the wafer surface in the same manner as low-temperature polysilicon layer 30 (see FIG. 4C).

Furthermore, in the case of using this SOG, HF treatment cannot be performed. This is because, if the wafer is immersed in HF solution, the SOG is immediately etched off to its original state. Furthermore, endpoint detection of the SOG surface can be confirmed by the presence of its water breakdown.

When the average flatness of the surfaces of 25 active layer wafers produced by this SOG was measured, in contrast to flatness being 0.24 μm with the method of the prior art, favorable results of 0.02 μm were obtained.

Furthermore, although the above has provided individual explanations of each embodiment, the present invention can also be carried out by combining the first and third embodiments, first and fourth embodiments, second and third embodiments or second and fourth embodiments.

INDUSTRIAL APPLICABILITY

According the first invention, since a negative resist is coated onto the back surface of a silicon wafer followed by exposure of the entire surface to light, the periphery of the negative resist film coated on the back of the wafer can be prevented from being dissolved by developing solution during surface negative resist development treatment following coating of the back surface negative resist.

In particular, the present invention can also be applied to a laminated dielectric isolated wafer. In this case, growing a thick polysilicon layer by high-temperature CVD is not required.

According to the second invention, after polishing the surface of a dielectric isolated wafer, polysilicon is deposited (grown) by CVD or SOG is coated and then baked onto the wafer surface to fill in depressions in the wafer surface. Subsequently, since the polysilicon layer or SOG layer is then removed by polishing while leaving behind the filled in portion of the depressions, the surface of the dielectric isolated wafer can be flattened.

In particular, in the case of applying the present invention to a laminated dielectric isolated wafer, since an active layer wafer having a dielectric isolated silicon island, and a supporting substrate layer are laminated to produce a laminated dielectric isolated wafer, and depressions in the surface of this laminated dielectric isolated wafer are filled in to flatten the surface, a advantages are obtained over dielectric isolated wafers not produced by this lamination method. Namely, as a result of substituting the supporting substrate with a single crystal silicon wafer, warping of the wafer can be held to, for example, 150 μm or less even in the case of large diameter wafers measuring 5 inches or more.

Moreover, in the case of using low-temperature polysilicon formed by low-temperature cvd at 550–700° C. for the polysilicon layer for filling in the depressions in the production method of a dielectric isolated wafer, the risk of the depressions reforming in the wafer surface can be reduced during removal of this polysilicon layer by polishing.

What is claimed is:

1. A production method of a dielectric isolated wafer comprising:

covering the front and back surfaces of the silicon wafer with a mask oxide film, providing a windowed resist film on the surface of this mask oxide film, exposing a portion of the silicon wafer surface through a window by forming a window of a prescribed pattern in a mask oxide film by using this resist film as a mask, forming a dielectric isolation groove by anisotropic etching of this exposed portion of the silicon wafer surface, forming a dielectric isolated oxide film on the surface of the silicon wafer, growing a polysilicon layer on this dielectric isolated oxide film, and grinding and polishing the silicon wafer from the back side to cause a silicon island separated by a dielectric isolated oxide film to appear on the polished surface; wherein the process of providing the above windowed resist film comprises:

a step in which a negative resist is coated onto the surface of said mask oxide film, a step in which a window of a prescribed pattern is formed in this negative resist film, a step in which a negative resist is coated on the mask oxide film on the back side, a step in which the entire surface of this back side negative resist film is exposed to light, and a step in which the back surface negative resist adhered to the window of the front surface negative resist is removed.

2. A production process of a dielectric isolated wafer according to claim 1, wherein said dielectric isolated wafer is produced by laminating an active surface layer in which said dielectric isolated silicon island is formed, and its supporting substrate layer.

3. A production method of a dielectrically isolated monocrystalline silicon wafer, comprising: forming a polysilicon surface layer on the dielectrically isolated monocrystalline silicon wafer having silicon islands and dielectric isolating layers having depressions formed between the silicon islands during polishing to form the silicon island; and polishing the polysilicon surface layer formed on the dielectrically isolated monocrystalline silicon wafer so that said depressions between silicon islands are filled with said polysilicon layer.

4. A production method according to claim 3, wherein said dielectrically isolated monocrystalline silicon wafer is formed by grinding and polishing the monocrystalline silicon wafer after a supporting monocrystalline silicon wafer is laminated on the surface of said monocrystalline silicon wafer opposite to the surface where the dielectric isolated silicon island is to be formed.

5. A production process of a dielectric isolated wafer comprising:

a step in which, by polishing the surface of a dielectric isolated wafer on which a dielectric isolated silicon island is formed, followed by forming a polysilicon layer by CVD on the surface of this dielectric isolated wafer, depressions in the wafer surface that have formed during surface polishing of said dielectric isolated wafer are filled in, and a step in which this polysilicon layer is removed by polishing while leaving behind the filled in portion of said depressions.

6. A production process of a dielectric isolated wafer according to claim 5, wherein said polysilicon layer for filling in said depressions is formed by low-temperature CVD at 550–700° C.

7. A dielectric isolated wafer in which, by polishing the surface of a dielectric isolated wafer on which is formed a dielectric isolated silicon island, followed by forming an SOG layer on the surface of this dielectric isolated wafer, depressions in the wafer surface that have formed during surface of polishing of said dielectric isolated wafer are filled in, after which this SOG layer is removed by polishing while leaving behind the filled in portion of said depressions.

8. A production process of a dielectric isolated wafer comprising:

a step in which, by polishing the surface of a dielectric isolated wafer on which a dielectric isolated silicon island is formed, followed by coating and baking SOG onto the surface of this dielectric isolated wafer, depressions in the wafer surface that have formed during surface polishing of said dielectric isolated wafer are filled in, and a step in which this SOG layer is removed by polishing while leaving behind the filled in portion of said depressions.

* * * * *